US008411428B2

(12) United States Patent
Lu et al.

(10) Patent No.: US 8,411,428 B2
(45) Date of Patent: Apr. 2, 2013

(54) PORTABLE STORAGE DEVICE

(75) Inventors: Li-Houng Lu, Tu-Cheng (TW);
Ching-Min Lin, Tu-Cheng (TW);
Hui-Ling Chen, Tu-Cheng (TW);
Hsin-Yung Yang, Tu-Cheng (TW);
Yuan-Chih Ku, Tu-Cheng (TW);
Tzu-Yuan Liu, Tu-Cheng (TW); Yi-En Chen, Tu-Cheng (TW); Kuan-Ling Chen, Tu-Cheng (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 276 days.

(21) Appl. No.: 12/943,014

(22) Filed: Nov. 10, 2010

(65) Prior Publication Data
US 2012/0008272 A1  Jan. 12, 2012

(30) Foreign Application Priority Data

Jul. 9, 2010 (TW) ................................ 99213103 U

(51) Int. Cl.
*G06F 1/16* (2006.01)
*H05K 5/00* (2006.01)
(52) U.S. Cl. ........... 361/679.32; 361/679.39; 361/679.4; 361/737; 439/131
(58) Field of Classification Search ............. 361/679.32, 361/737; 439/131
See application file for complete search history.

(56) References Cited

U.S. PATENT DOCUMENTS

| | | | | |
|---|---|---|---|---|
| 6,362,851 B1 * | 3/2002 | Lavelle et al. | ........... | 348/333.01 |
| 6,676,419 B1 * | 1/2004 | Lin et al. | ...................... | 439/76.1 |
| 7,092,256 B1 * | 8/2006 | Salazar et al. | ................ | 361/737 |
| 7,286,182 B2 * | 10/2007 | Silverbrook et al. | ......... | 348/375 |
| 7,451,262 B2 * | 11/2008 | Yetukuri | ....................... | 711/103 |
| 7,465,925 B2 * | 12/2008 | Antanovskaya et al. | .. | 250/336.1 |
| 7,535,719 B2 * | 5/2009 | Hiew et al. | ..................... | 361/737 |
| 7,581,967 B2 * | 9/2009 | Collantes et al. | ............. | 439/131 |
| D616,449 S * | 5/2010 | Lo | ............................. | D14/480.7 |
| D620,018 S * | 7/2010 | Nan et al. | .................. | D14/480.7 |
| 7,787,243 B2 * | 8/2010 | Salazar et al. | ........... | 361/679.31 |
| 7,869,219 B2 * | 1/2011 | Ma et al. | ....................... | 361/737 |
| 8,027,165 B2 * | 9/2011 | Wallace et al. | ................ | 361/737 |
| 2006/0073718 A1 * | 4/2006 | Regen et al. | .................. | 439/131 |
| 2006/0190664 A1 * | 8/2006 | Chen | ........................... | 710/313 |
| 2006/0240692 A1 * | 10/2006 | Regen et al. | .................. | 439/131 |
| 2007/0088913 A1 * | 4/2007 | Hu | ................................. | 711/115 |
| 2007/0097789 A1 * | 5/2007 | Coffey | ............................ | 367/99 |
| 2007/0279852 A1 * | 12/2007 | Daniel et al. | .................. | 361/683 |
| 2008/0247124 A1 * | 10/2008 | Lai et al. | ....................... | 361/679 |
| 2008/0261450 A1 * | 10/2008 | Nguyen et al. | ................ | 439/607 |
| 2009/0042433 A1 * | 2/2009 | Bushby | ........................... | 439/352 |
| 2009/0061696 A1 * | 3/2009 | Lin et al. | ....................... | 439/701 |
| 2009/0091626 A1 * | 4/2009 | Kaplan et al. | ............. | 348/207.1 |
| 2009/0190277 A1 * | 7/2009 | Hiew et al. | ....................... | 361/56 |
| 2010/0330828 A1 * | 12/2010 | Tang et al. | .................... | 439/131 |
| 2011/0130017 A1 * | 6/2011 | Chou et al. | .................... | 439/131 |

\* cited by examiner

*Primary Examiner* — Adrian S Wilson
*Assistant Examiner* — Abhishek Rathod
(74) *Attorney, Agent, or Firm* — Altis Law Group, Inc.

(57) ABSTRACT

A portable storage device includes a case, a USB plug, a sliding button, a delete button, a controller and a memory module. The delete button is electrically coupled with the controller. Data stored in the device can be deleted through operation of the delete button without a host device.

6 Claims, 3 Drawing Sheets

PORTABLE STORAGE DEVICE

BACKGROUND

1. Technical Field

The present disclosure relates to a portable storage device, and more particularly to a portable storage device with individual processing functions.

2. Description of Related Art

Portable storage devices, such as cards or external hard drives, are often used for storing data and transmitting data among different electronic devices. However, data access between portable storage devices and a host device, such as a computer, is usually controlled by the host but not by the portable storage devices, such that data stored on the device cannot be managed by the portable storage itself when it is not connected to a host. Thus, convenience for the user is affected.

DETAILED DESCRIPTION

Figure 1A:
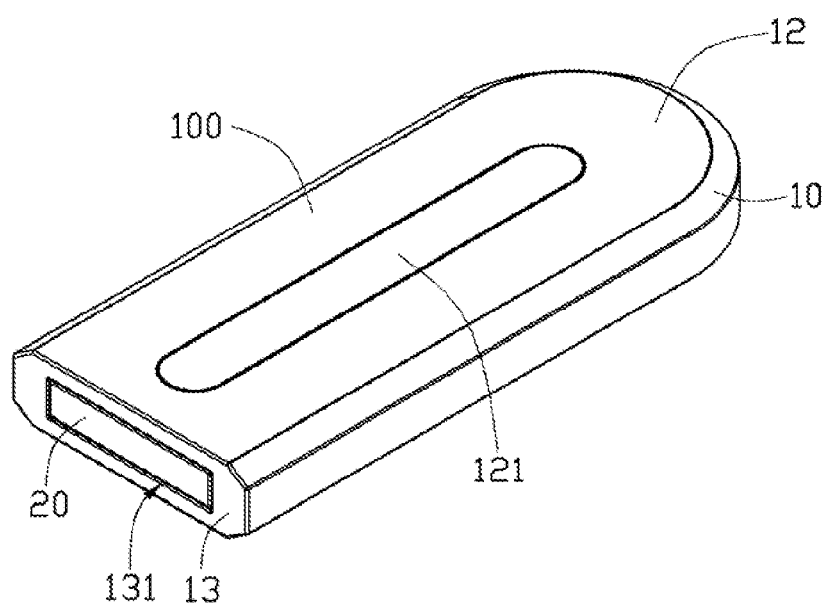
FIG. 1A is a view of one embodiment of a portable storage device.
Figure 1B:
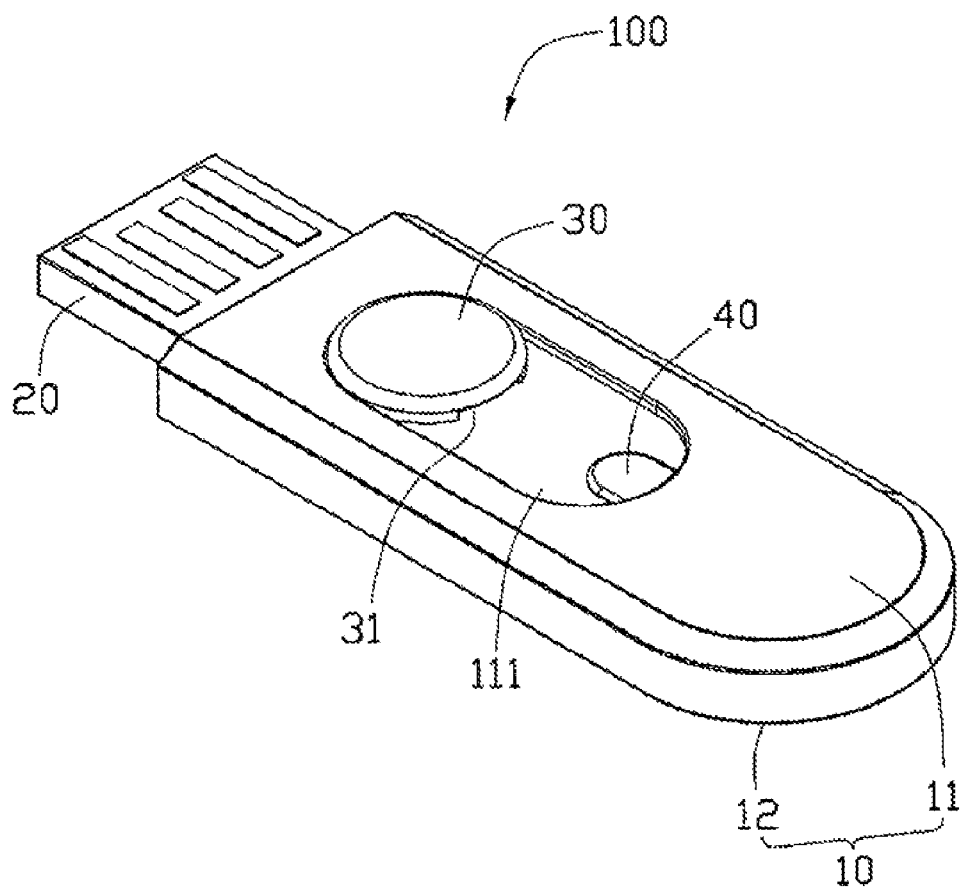
FIG. 1B is another view of one embodiment of the portable storage device.

FIG. 1A and FIG. 1B are two views of one embodiment of a portable storage device 100.

The portable storage device 100 includes a case 10, a USB plug 20, a slide button 30, a delete button 40, a controller 50 and a memory module 60. The case 10 includes a first surface 11, a second surface 12 opposite to the first surface 11 and a terminal portion 13 disposed between the first surface 11 and the second surface 12.

In one embodiment, the first surface 11 comprises a slide slot 111. A display 121 is disposed in the second surface 12. An opening 131 is disposed in the terminal portion 13, and the opening 131 is through the slide slot 111. The USB plug 20 can be housing in the case 10 through the opening 131. The slide button 30 is round, with a receiving portion is disposed in one terminal of the slide button 30. The slide button 30 can be received in the slide slot 111 and be fixed with the USB plug 20. When the slide button 30 moves along the slide slot 111, the slide button 30 carries the USB plug 20 to slide in the case 10. Thus, the USB plug 20 can extend out of the case 10 or be housed in the case 10 according to the movement of the slide button 30. When the slide button 30 slides to one terminal of the slide slot 111 near the opening 131, the USB plug 20 extends out of the case 10 from the opening 131. When the slide button 30 slides to the other terminal of the slide slot 111 away from the opening 131, the USB plug 20 is completely housed in the case 10. The delete button 40 is disposed in the terminal of the slide slot 111 away from the opening 131. When the slide button 30 slides to the terminal of the slide slot 111 away from the opening 131, the USB plug 20 is completely housed in the case 10. A containing portion 31 is disposed in one terminal of the slide button 30. The delete button 40 is housed in the containing portion 31 when the slide button 30 slides to the terminal of the slide slot 111 away from the opening 131.

Figure 2:
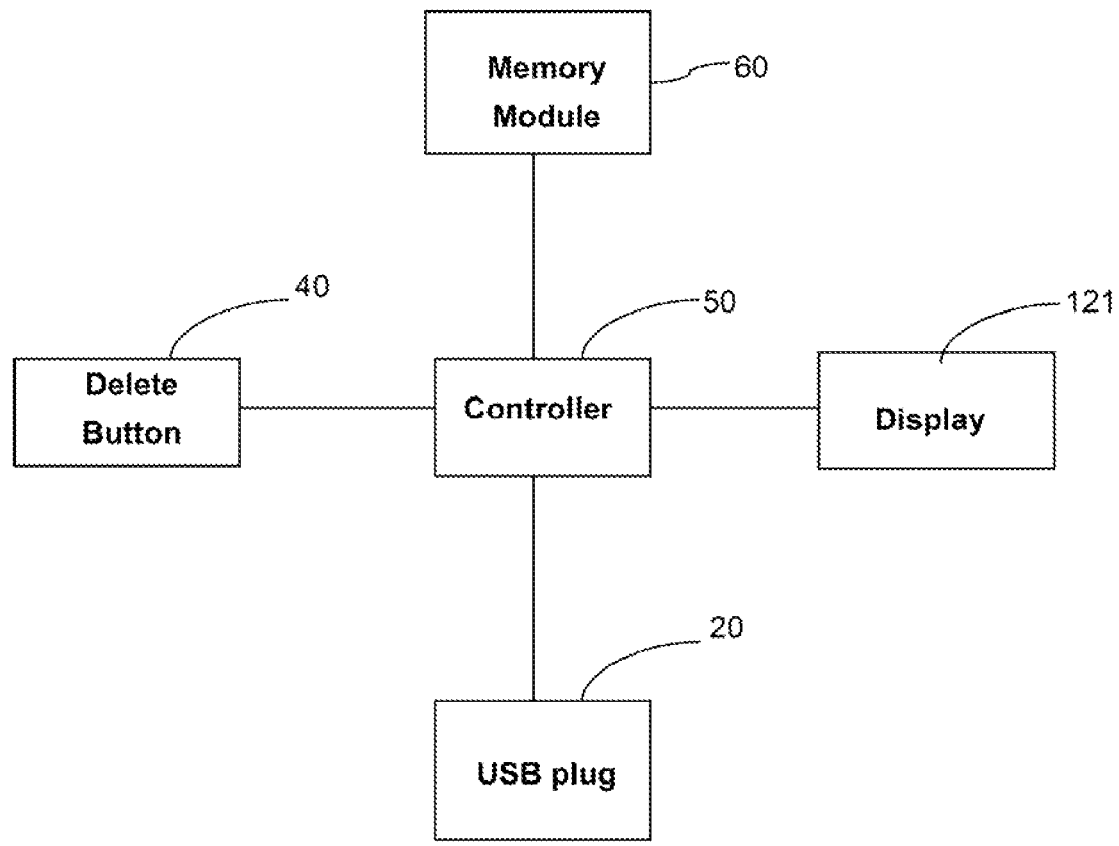
FIG. 2 is a block diagram of one embodiment of the portable storage device.

FIG.2 is a block diagram of one embodiment of the portable storage device. The portable storage device includes the controller 50 and the memory module 60, both disposed in the case 10. The controller 50 is electrically coupled to the USB plug 20, the display 121, the delete button 40 and the memory module 60. When the USB plug 20 is electrically coupled with a electronic device, the controller 50 controls the memory module 60 to transmit or store data to electronic device, whereby the electronic device can access data or store data from the memory module 60. Moreover, the controller 50 is capable of displaying content information on the display 121. In one embodiment, the content information includes total storage capability info, used volume or the type of stored data. In addition, the controller 50 allows direct deletion of data stored in the memory module 60 via the delete button 40 with no requirement for a host device defined in USB specification, such as a computer, so that user can delete data stored in the portable storage device 100 by pushing the delete button 40 directly.

In one embodiment, data stored in the memory module 60 of the portable storage device 100 can be deleted by pushing the delete button 40 without any host device such as computer. The USB plug 20 can be housed in the case 10. Moreover, the delete button 40 can be housed in the slide button 30 so as to avoid possibility of mistakenly deleting data. In addition, information about the data stored in the memory module 60 can be shown in the display 121.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A portable storage device, comprising:
   a case;
   a USB plug;
   a storage, storing data transmitted through the USB plug; and
   a controller, electrically coupled to the USB plug and the storage, and controlling data accessed through the USB plug; and
   a delete button disposed in one terminal of a slide slot on the case and electrically coupled to the controller, wherein the controller deletes data stored in the storage when the delete button is operated, a slide button disposed in the slide slot and movable along the slide slot, a containing portion disposed in one terminal of the slide button, wherein the delete button is housed in the containing portion when the slide button slides to the terminal of the slide slot.

2. The portable storage device of claim 1, further comprising a display electrically coupled with the controller, wherein the display displays information of data stored in the storage.

3. The portable storage device of claim 2, wherein the information is selected from the group consisting of total storage capability of the storage, used volume of the storage, and the type of stored data of the storage.

4. The portable storage device of claim 2, wherein another terminal of the slide button is fixed with the USB plug, and movement of the slide button along the slide slot allows the USB plug to be extended out of the case or be housed in the case.

5. The portable storage device of claim 4, wherein the slide slot is disposed in a first surface of the case, and where the slide button is capable of movement in the slide slot along the direction of the case.

6. The portable storage device of the claim 5, wherein the display is defined in a second surface of the case.

* * * * *